(12) United States Patent
Lee

(10) Patent No.: US 8,472,260 B2
(45) Date of Patent: Jun. 25, 2013

(54) SEMICONDUCTOR MEMORY APPARATUS AND METHOD FOR DISCHARGING WORDLINE THEREOF

(75) Inventor: Jae Ho Lee, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 339 days.

(21) Appl. No.: 12/963,341

(22) Filed: Dec. 8, 2010

(65) Prior Publication Data

US 2012/0026801 A1 Feb. 2, 2012

(30) Foreign Application Priority Data

Jul. 29, 2010 (KR) ........................ 10-2010-0073310

(51) Int. Cl.
*G11C 11/34* (2006.01)
*G11C 16/06* (2006.01)

(52) U.S. Cl.
USPC ............. 365/185.25; 365/185.22; 365/185.24

(58) Field of Classification Search
USPC ............................ 365/185.25, 185.22, 185.24
See application file for complete search history.

(56) References Cited

U.S. PATENT DOCUMENTS

| 5,506,803 | A | 4/1996 | Jex |
| 5,604,712 | A * | 2/1997 | Priebe ...................... 365/230.06 |
| 6,363,011 | B1 | 3/2002 | Hirose et al. |
| 2002/0075727 | A1 | 6/2002 | Jeong et al. |
| 2005/0078520 | A1 * | 4/2005 | Kim ......................... 365/185.17 |
| 2008/0151616 | A1 | 6/2008 | Ashokkumar et al. |
| 2009/0097325 | A1 * | 4/2009 | Won et al. ................ 365/185.22 |

FOREIGN PATENT DOCUMENTS

| JP | 2000-100179 | 4/2000 |
| JP | 2005-108399 | 4/2005 |
| KR | 1020010044901 A | 6/2001 |
| KR | 1020020009493 A | 2/2002 |
| KR | 1020080035352 A | 4/2008 |

* cited by examiner

*Primary Examiner* — Toan Le
(74) *Attorney, Agent, or Firm* — William Park & Associates Patent Ltd.

(57) ABSTRACT

Various embodiments of a semiconductor apparatus having a discharge technology are disclosed. In one exemplary embodiment, the semiconductor apparatus may include a plurality of lines in which a selected line is driven by a first control voltage and an unselected line is driven by a second control voltage with a level lower than the first control voltage. The apparatus may also include a discharge control unit configured to form a discharge current path between a discharge node of the selected line and a common discharge node of the unselected line and induce a predetermined voltage difference between the discharge node and the common discharge node; and a common discharge unit configured to discharge current flowing through the discharge current path.

19 Claims, 6 Drawing Sheets

SEMICONDUCTOR MEMORY APPARATUS AND METHOD FOR DISCHARGING WORDLINE THEREOF

CROSS-REFERENCE TO RELATED APPLICATION

The present application claims priority under 35 U.S.C. §119(a) to Korean Patent Application No. 10-2010-0073310, filed on Jul. 29, 2010, in the Korean Intellectual Property Office, which is incorporated herein by reference in its entirety as if set forth in full.

BACKGROUND

1. Technical Field

The present invention relates to a semiconductor apparatus and a semiconductor memory apparatus, and more particularly, to a discharge technology.

2. Related Art

FIG. 1 is a diagram illustrating the conceptual configuration of a conventional semiconductor memory apparatus. The semiconductor memory apparatus of FIG. 1 includes a memory unit 10, a first wordline discharge unit 20, and a second wordline discharge unit 30.

The memory unit 10 is divided into a first memory string 11 and a second memory string 12. The first memory string 11 is connected to an even bit line BL_E, and the second memory string 12 is connected to an odd bit line BL_O. In each memory string, a plurality of memory cells are connected in series. The first memory string 11 will be representatively described below. A total of 64 nonvolatile memory cells MC0_E through MC63_E are connected in series between a first selection transistor MN10 and a second selection transistor MN11. The first selection transistor MN10 is controlled by the voltage level of a first select signal line DSL, and the second selection transistor MN11 is controlled by the voltage level of a second select signal line SSL. Access to the 64 nonvolatile memory cells MC0_E through MC63_E is controlled by the voltage levels of corresponding wordlines WL0 through WL63. Each of the nonvolatile memory cells is composed of a transistor which includes a control gate and a floating gate.

During a programming operation of the semiconductor memory apparatus, one local wordline selected from the plurality of is local wordlines is driven by a wordline programming voltage VPGM, and remaining unselcted local wordlines are driven by a wordline pass voltage VPASS, which has a level lower than the wordline programming voltage VPGM. When the programming operation is completed, all of the plurality of wordlines WL0 through WL63 are discharged.

For illustration purposes, it is assumed that a first wordline WL0 is selected among the plurality of wordlines WL0 through WL63 and is charged with the wordline programming voltage VPGM and that the remaining unselected wordlines WL1 through WL63 are charged with the wordline pass voltage VPASS, as indicated in FIG. 1.

The first wordline discharge unit 20 is configured to discharge a discharge node N1 of the first wordline WL0 selected among the plurality of wordlines WL0 through WL63 in response to a first discharge pulse signal DIS_EN1. Accordingly, during a period in which the first discharge pulse signal DIS_EN1 is activated, the first wordline WL0 is discharged, and its voltage level is lowered.

The second wordline discharge unit 30 is configured to discharge a common discharge node N2 of the remaining unselected wordlines WL1 through WL63 in response to a second discharge pulse signal DIS_EN2. Accordingly, during a period in which the second discharge pulse signal DIS_EN2 is activated, the remaining unselected wordlines WL1 through WL63 are discharged, and their is voltage levels are lowered.

FIG. 2 is a diagram illustrating a wordline discharge operation of the semiconductor memory apparatus shown in FIG. 1. The principal operations of the semiconductor memory apparatus having the above-mentioned configuration will be described below with reference to FIGS. 1 and 2.

During a programming operation, as mentioned above, the selected wordline WL0 is charged with the wordline programming voltage VPGM, and the remaining unselected wordlines WL1 through WL63 are charged with the wordline pass voltage VPASS. When a discharge operation for the entire wordlines WL0 through WL63 is started, the selected wordline WL0 is discharged through the first wordline discharge unit 20, and the remaining unselected wordlines WL1 through WL63 are discharged through the second wordline discharge unit 30.

At this time, while the first wordline discharge unit 20 discharges only one selected wordline WL0, the second wordline discharge unit 30 should discharge the remaining 63 wordlines WL1 through WL63. Therefore, when compared to the first wordline discharge unit 20, the second wordline discharge unit 30 requires a greater discharge time. In general, the greater the number of loadings that the second wordline discharge unit 30 must discharge is, the greater the time it is for the second wordline discharge unit 30 to discharge them.

Moreover, not only during the programming operation but also during the discharge operation, the voltage of the selected wordline WL0 should be lowered while maintaining a level higher than the voltages of the remaining wordlines WL1 through WL63. As the number of memory cells included in a memory string increases, the number of loadings that the second wordline discharge unit 30 should discharge increases. Accordingly, during the discharge operation, there may be an occasion where the voltages VPASS (N2) of the remaining wordlines WL1 through WL63 could become higher than the voltage VPGM(N1) of the first wordline WL0, as shown in FIG. 2. If such an event occurs, the distribution of threshold voltages of the memory cells connected to the wordlines is likely to change, thereby deteriorating stability.

SUMMARY

Accordingly, there is a need for an improved semiconductor apparatus having a technology that may obviate one or more of the above-mentioned problems. It should be understood, however, that some aspects of the invention may not necessarily obviate one or more of those problems.

To attain the advantages and in accordance with the purpose of the invention, as embodied and broadly described herein, one aspect of the invention may provide a semiconductor apparatus comprising: a plurality of lines having a selected line and an unselected line, the selected line being driven by a first control voltage, the unselected line being driven by a second control voltage, the second control voltage being lower than the first control voltage; a discharge control unit configured to form a discharge current path between a discharge node of the selected line and a common discharge node of the unselected line and induce a predetermined voltage difference between the discharge node and the common discharge node; and a common discharge unit configured to discharge current flowing through the discharge current path.

According to another exemplary aspect, a semiconductor memory apparatus may comprise: a plurality of wordlines having a selected wordline and an unselected wordline, the selected wordline being driven by a first wordline control voltage, the unselected wordline being driven by a second wordline control voltage, the second wordline control voltage being lower than the first wordline control voltage; a discharge control unit configured to form a discharge current path between a discharge node of the selected wordline and a common discharge node of the unselected wordline and induce a predetermined voltage difference between the discharge node and the common discharge node; and a common wordline discharge unit configured to discharge current flowing through the discharge current path.

Still another exemplary aspect of the present invention is may provide a semiconductor memory apparatus comprising a plurality of wordlines having a selected wordline and an unselected wordline, the selected wordline being driven by a first wordline control voltage, the unselected wordline being driven by a second wordline control voltage, the second wordline control voltage being lower than the first wordline control voltage. The semiconductor memory apparatus may also comprise: a discharge control unit configured to form a discharge current path between a discharge node of the selected wordline and a common discharge node of the unselected wordline in response to a discharge control pulse signal, the discharge control unit being further configured to induce a predetermined voltage difference between the discharge node and the common discharge node; a first wordline discharge unit configured to discharge the discharge node in response to a first discharge pulse signal; a second wordline discharge unit configured to discharge the common discharge node in response to a second discharge pulse signal; and a discharge control signal generation unit configured to generate the discharge control pulse signal, the second discharge pulse signal, and the first discharge pulse signal, wherein the first discharge pulse signal is activated after a predetermined time from an activation timing of the second discharge pulse signal and the discharge control pulse signal.

Certain exemplary aspects of the present invention may provide a method of discharging a plurality of wordlines, where at least one wordline is selected and driven by a first wordline control voltage and at least one unselected wordline driven by a second wordline control voltage with a level lower than the first wordline control voltage. The method may comprise: forming a discharge current path such that a predetermined voltage difference is induced between a discharge node of the selected wordline and a common discharge node of the unselected wordline; discharging the common discharge node for a predetermined time; and discharging the discharge node after discharging the common discharge node for the predetermined time.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
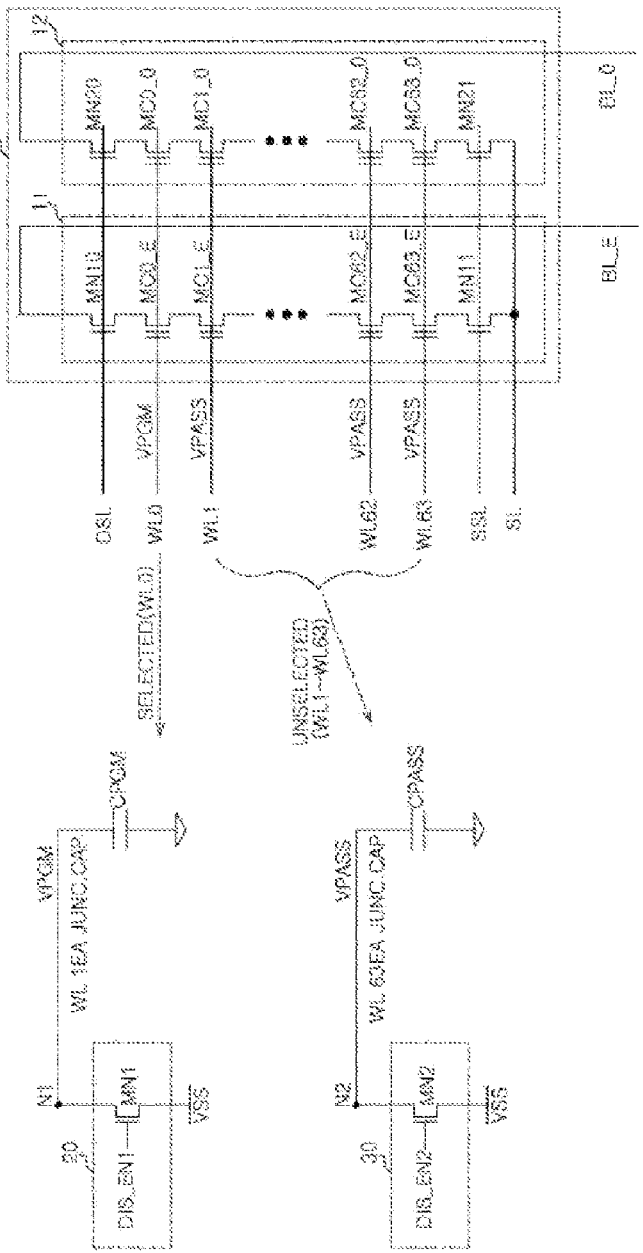
FIG. 1 is a diagram illustrating the conceptual configuration of a conventional semiconductor memory apparatus.
Figure 2:
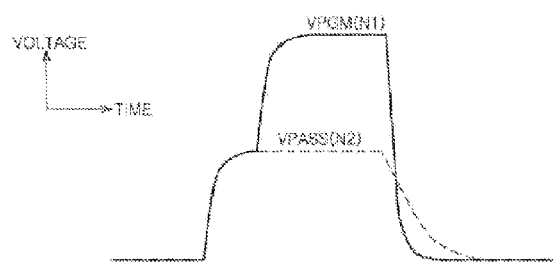
FIG. 2 is a diagram illustrating a wordline discharge operation of the semiconductor memory apparatus shown in FIG. 1.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 3:
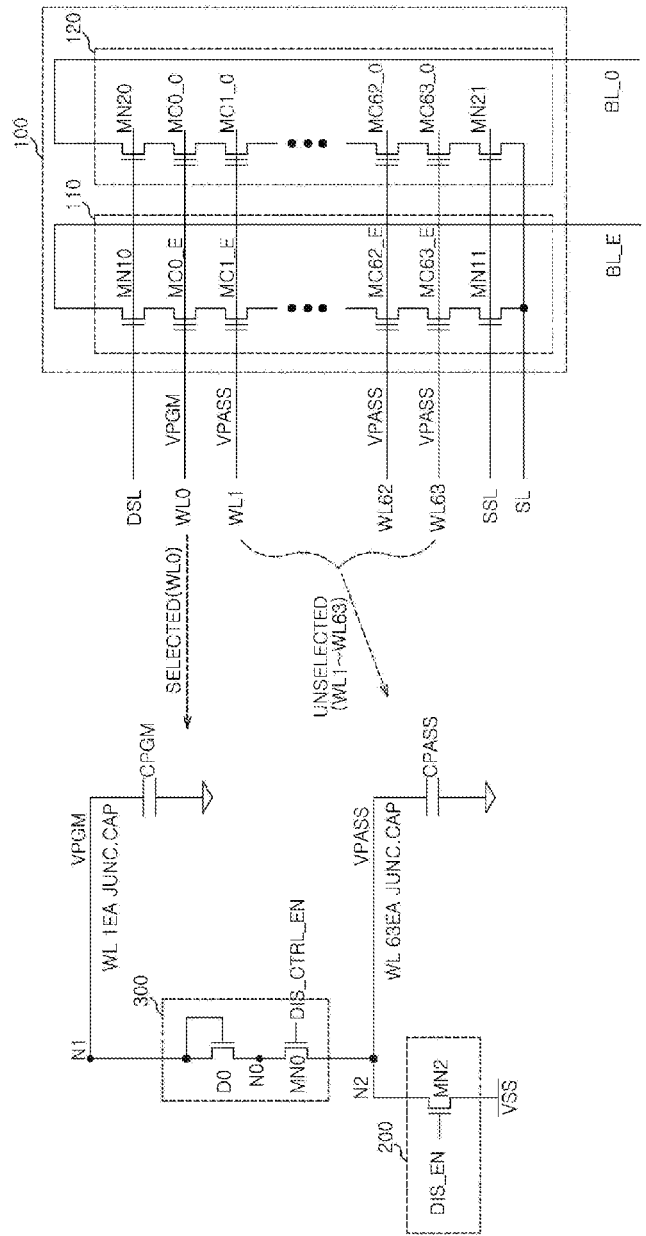
FIG. 3 is a diagram illustrating a configuration of a semiconductor memory apparatus in accordance with an exemplary embodiment of the present invention.

It should be noted, however, that certain terms, symbols, and signs used to designate certain devices, blocks, and other multi-part elements in the present disclosure may also be used to is designate sub-elements as the occasion demands. Thus, the same terms, symbols, and signs may not necessarily designate the same devices, blocks, and elements in the disclosed circuitry. In general, the values of a circuit's logic signals and binary data are termed as either a high level (H) or a low level (L) depending on their voltage levels and, at certain occasions, may be represented as '1' and '0'. FIG. 3 is a diagram illustrating a configuration of a semiconductor memory apparatus in accordance with an exemplary embodiment of the present invention. FIG. 3 depicts only a simplified configuration of an exemplary semiconductor memory apparatus for purposes of providing more clearer explanation of the technical features contemplated by the present invention. Thus, it should be explicitly noted that the exemplary semiconductor memory of FIG. 3 may include, although not depicted in the figure, any additional elements or materials that may be apparent to those skill in the art.

Referring to FIG. 3, an exemplary semiconductor memory apparatus may include a memory unit 100, a common wordline discharge unit 200, and a discharge control unit 300.

The memory unit 100 is divided into a first memory string 110 and a second memory string 120. The first memory string 110 is connected to an even bit line BL_E, and the second memory string 120 is connected to an odd bit line BL_O. In each memory string, a plurality of memory cells are connected in series. The first memory string 110 will be representatively described below.

A total of 64 nonvolatile memory cells MC0_E through MC63_E are connected in series between a first selection transistor MN10 and a second selection transistor MN11. The first selection transistor MN10 is controlled by the voltage level of a first select signal line DSL, and the second selection transistor MN11 is controlled by the voltage level of a second select signal line SSL. Access to the 64 nonvolatile memory cells MC0_E through MC63_E is controlled by the voltage levels of corresponding wordlines WL0 through WL63. In some exemplary embodiments, each of the nonvolatile memory cells may be composed of a transistor that includes a control gate and a floating gate.

During a programming operation of the semiconductor memory apparatus, one local wordline selected among a plurality of local wordlines is driven by a first wordline control voltage VPGM, and remaining unselected local wordlines are driven by a second wordline control voltage VPASS, which has a level lower than the first wordline control voltage VPGM. When the programming operation is completed, all of the local wordlines WL0 through WL63 are discharged.

While it is exemplified in the present embodiment that only one wordline is selected, it is to be understood that two or more wordlines can be selected. Nonetheless, the number of unselected wordlines is generally greater than the number of selected wordlines.

For illustration purposes only, it is assumed that a first wordline WL0 is selected among the plurality of wordlines WL0 through WL63 and is charged with the first wordline control voltage VPGM and the remaining wordlines WL1 through WL63 are charged with the second wordline control voltage VPASS. The first wordline control voltage VPGM designates a wordline programming voltage, and the second wordline control voltage VPASS designates a wordline pass voltage.

The discharge control unit 300 is configured to form a discharge current path between a discharge node N1 of the first wordline WL0 and a common discharge node N2 of the remaining unselected wordlines WL1 through WL63 and induce a predetermined voltage difference between the discharge node N1 and the common discharge node N2.

In the present embodiment, the discharge control unit 300 is composed of a diode D0 and a connection part MN0. The diode D0 is connected between the discharge node N1 and a first node N0. The connection part MN0 (e.g., an NMOS transistor) is connected between the first node N0 and the common discharge node N2 and is selectively turned on under the control of a discharge control pulse signal DIS_CTRL_EN.

Accordingly, if the discharge control pulse signal DIS_CTRL_EN is activated, a voltage difference corresponding to the threshold voltage of the diode D0 is induced between the discharge node N1 and the common discharge node N2. While the diode D0 includes an NMOS transistor in the present embodiment, it is conceivable that the diode D0 may include a PMOS transistor or a junction transistor. Also, a target voltage difference can be induced by using a plurality of MOS transistors.

The common wordline discharge unit 200 is configured to discharge current flowing through the discharge current path. In the present embodiment, the common wordline discharge unit 200 is connected between the common discharge node N2 and a discharge voltage terminal VSS, and includes an NMOS transistor MN2, which is controlled by a common discharge pulse signal DIS_EN.

Figure 4:
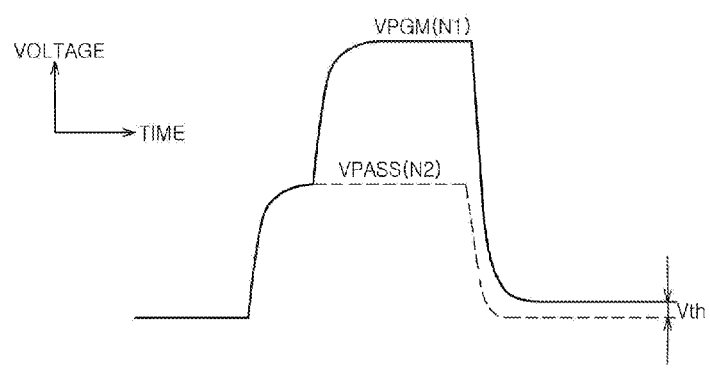
FIG. 4 is a diagram illustrating a wordline discharge operation of the semiconductor memory apparatus shown in FIG. 3.

FIG. 4 is a diagram illustrating an exemplary wordline discharge operation of the semiconductor memory apparatus shown in FIG. 3. The principal operations of the semiconductor memory apparatus having the above-mentioned configuration will be described below with reference to FIGS. 3 and 4.

During a programming operation, the first wordline WL0 is charged with the wordline programming voltage VPGM, and the remaining wordlines WL1 through WL63 are charged with the wordline pass voltage VPASS. When a discharge operation for the plurality of wordlines WL0 through WL63 begins, the discharge current path is formed between the discharge node N1 of the first wordline WL0 and the common discharge node N2 of the remaining wordlines WL1 through WL63 by the discharge control unit 300.

At this time, the voltage level of the discharge node N1 is maintained higher by a predetermined level than the voltage level of the common discharge node N2 by virtue of the discharge control unit 300. Accordingly, even when the common wordline discharge unit 200 discharges all of the plurality of wordlines WL0 through WL63, the voltage level of the discharge node N1 is always maintained higher than the voltage level of the common discharge node N2. The voltage level of the discharge node N1 is discharged finally to the threshold voltage (Vth) of the diode D0, as shown in FIG. 4.

That is, in the semiconductor memory apparatus having a configuration consistent with the above-described embodiment, the distribution of the threshold voltages of the memory cells connected to the wordlines may be stably maintained since the voltage level of the selected wordline is maintained higher than the voltage levels of the unselected wordlines until the discharge operation is completed.

While a technology for discharging a plurality of wordlines is described in the present embodiment, the suggested technical principle can be applied to discharge of a plurality of lines of a general semiconductor device, e.g., a plurality of lines in which a selected line is driven by a first control voltage and at least one unselected line is driven by a second control voltage with a level lower than the first control voltage.

Figure 5:
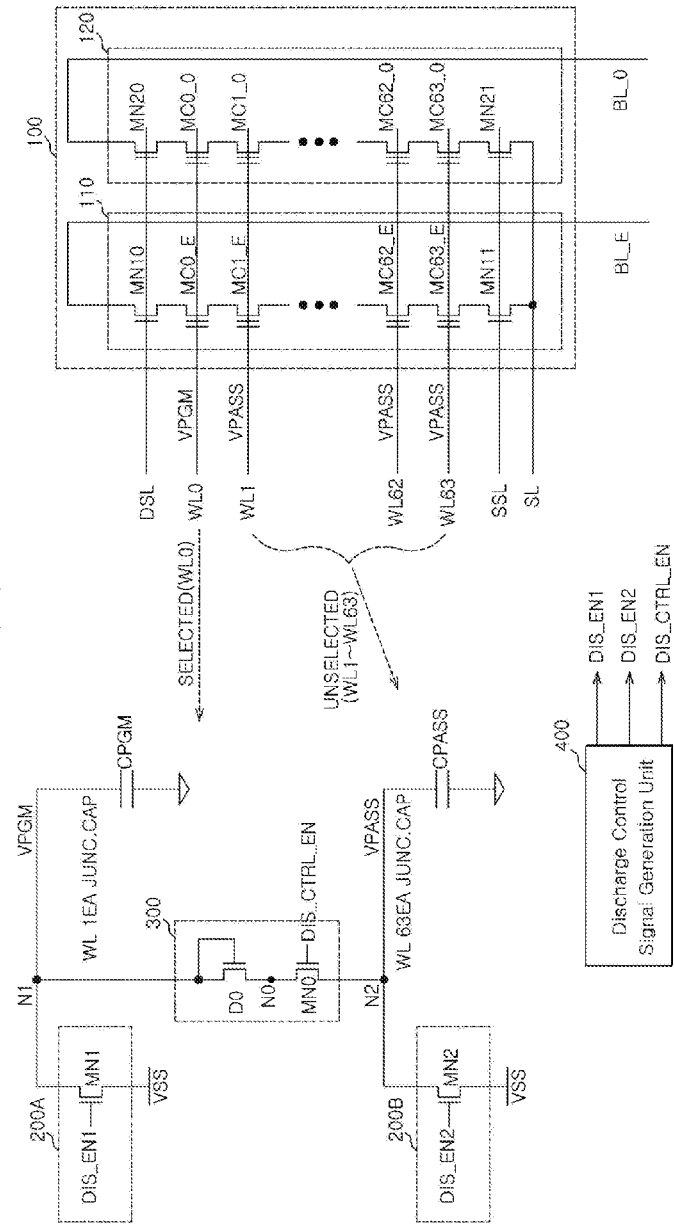
FIG. 5 is a diagram illustrating a configuration of a semiconductor memory apparatus in accordance with another exemplary embodiment of the present invention.

FIG. 5 is a diagram illustrating a configuration of a is semiconductor memory apparatus in accordance with another exemplary embodiment of the present invention. FIG. 5 depicts only a simplified configuration of an exemplary semiconductor memory apparatus to facilitate understanding of the technical features contemplated by the present embodiment.

Referring to FIG. 5, a semiconductor memory apparatus may include a memory unit 100, a first wordline discharge unit 200A, a second wordline discharge unit 200B, a discharge control unit 300, and a discharge control signal generation unit 400.

The memory unit 100 is divided into a first memory string 110 and a second memory string 120. The first memory string 110 is connected to an even bit line BL_E, and the second memory string 120 is connected to an odd bit line BL_O. In each memory string, a plurality of memory cells are connected in series. The first memory string 110 will be representatively described below.

A total of 64 nonvolatile memory cells MC0_E through MC63_E are connected in series between a first selection transistor MN10 and a second selection transistor MN11. The first selection transistor MN10 is controlled by the voltage level of a first select signal line DSL, and the second selection transistor MN11 is controlled by the voltage level of a second select signal line SSL. Access to the 64 nonvolatile memory cells MC0_E through MC63_E is controlled by the voltage levels of corresponding wordlines WL0 through WL63. In is some exemplary embodiments, each of the nonvolatile memory cells may be composed of a transistor that includes a control gate and a floating gate.

During a programming operation of the semiconductor memory apparatus, one local wordline selected among a plurality of local wordlines is driven by a first wordline control voltage VPGM, and remaining unselected local wordlines are driven by a second wordline control voltage VPASS, which has a level lower than the first wordline control voltage VPGM. When the programming operation is completed, all of the wordlines WL0 through WL63 are discharged.

While the present embodiment is shown to have only one wordline selected, it should be understood that two or more wordlines can be selected. At this time, among the plurality of wordlines, the number of unselected wordlines is greater than the number of selected wordlines.

For illustration purposes only, it is assumed that a first wordline WL0 is selected among the plurality of wordlines WL0 through WL63 and is charged with the first wordline control voltage VPGM and the remaining wordlines WL1 through WL63 are charged with the second wordline control voltage VPASS. The first wordline control voltage VPGM designates a wordline programming voltage, and the second wordline control voltage VPASS designates a wordline pass voltage.

The discharge control unit 300 is configured to form a is discharge current path between a discharge node N1 of the first wordline WL0 and a common discharge node N2 of the remaining unselected wordlines WL1 through WL63 in response to a discharge control pulse signal DIS_CTRL_EN and induce a predetermined voltage difference between the discharge node N1 and the common discharge node N2.

In the present embodiment, the discharge control unit 300 is composed of a diode D0 and a connection part MN0. The diode D0 is connected between the discharge node N1 and a first node N0. The connection part MN0 (e.g., an NMOS transistor) is connected between the first node N0 and the common discharge node N2 and is selectively turned on under the control of the discharge control pulse signal DIS_CTRL_EN.

Accordingly, if the discharge control pulse signal DIS_CTRL_EN is activated, a voltage difference corresponding to the threshold voltage of the diode D0 is induced between the discharge node N1 and the common discharge node N2. While the diode D0 includes an NMOS transistor in the present embodiment, it is conceivable that the diode D0 may include a PMOS transistor or a junction transistor. Also, a target voltage difference can be induced by using a plurality of MOS transistors.

The first wordline discharge unit 200A is configured to discharge the discharge node N1 in response to a first discharge pulse signal DIS_EN1. In the present embodiment, the first wordline is discharge unit 200A is connected between the discharge node N1 and a discharge voltage terminal VSS, and includes an NMOS transistor MN1, which is controlled by the first discharge pulse signal DIS_EN1.

The second wordline discharge unit 200B is configured to discharge the common discharge node N2 in response to a second discharge pulse signal DIS_EN2. In the present embodiment, the second wordline discharge unit 200B is connected between the common discharge node N2 and the discharge voltage terminal VSS, and includes an NMOS transistor MN2, which is controlled by the second discharge pulse signal DIS_EN2.

The discharge control signal generation unit 400 is configured to generate the discharge control pulse signal DIS_CTRL_EN, the second discharge pulse signal DIS_EN2, and the first discharge pulse signal DIS_EN1. The first discharge pulse signal DIS_EN1 is activated after a predetermined time from the activation timing of the second discharge pulse signal DIS_EN2 and the discharge control pulse signal DIS_CTRL_EN. The discharge control pulse signal DIS_CTRL_EN is deactivated before or at the activation timing of the first discharge pulse signal DIS_EN1. The discharge control signal generation unit 400 can include a general pulse generation circuit.

Figure 6:
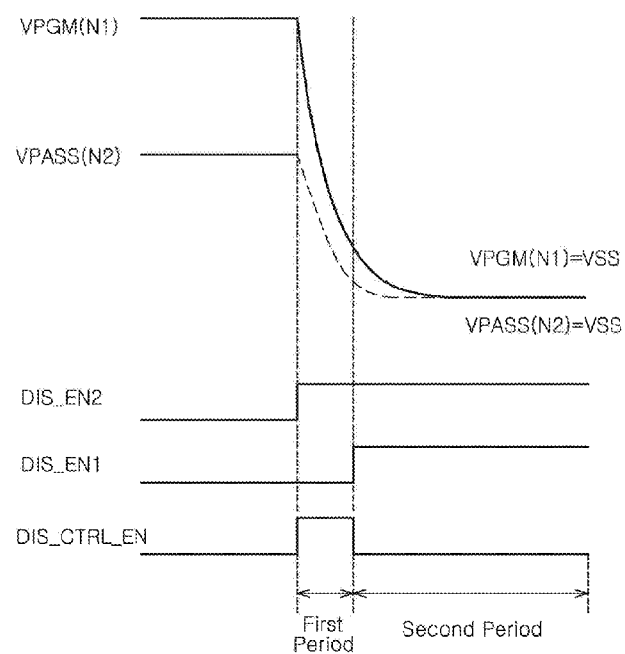
FIG. 6 is a diagram illustrating a wordline discharge operation of the semiconductor memory apparatus shown in FIG. 5.

FIG. 6 is a diagram illustrating an exemplary wordline discharge operation of the semiconductor memory apparatus shown in FIG. 5. The principal operations of the semiconductor memory is apparatus having the above-mentioned configuration will be described below with reference to FIGS. 5 and 6.

During a programming operation, the first wordline WL0 is charged with the wordline programming voltage VPGM, and the remaining wordlines WL1 through WL63 are charged with the wordline pass voltage VPASS.

First, an operation during a first period, in which the discharge control pulse signal DIS_CTRL_EN and the second discharge pulse signal DIS_EN2 are activated to high levels, is performed as described below. The discharge current path is formed between the discharge node N1 of the first wordline WL0 and the common discharge node N2 of the remaining wordlines WL1 through WL63 by the discharge control unit 300.

At this time, the voltage level of the discharge node N1 is maintained higher by a predetermined level than the voltage level of the common discharge node N2 by virtue of the discharge control unit 300. Accordingly, even when the second wordline discharge unit 200B discharges all of the plurality of wordlines WL0 through WL63, the voltage level of the discharge node N1 is always maintained higher than the voltage level of the common discharge node N2.

Next, an operation during a second period, in which the discharge control pulse signal DIS_CTRL_EN is deactivated to a low level and the first discharge pulse signal DIS_EN1 is activated to a high level, is performed as described below. During the first period, is the common discharge node N2 is discharged to the voltage level of the discharge voltage terminal VSS (i.e., the level of a ground voltage VSS), by the second wordline discharge unit 200B. However, the discharge node N1 is discharged only to a level higher by the threshold voltage of the diode D0 than the common discharge node N2 by virtue of the discharge control unit 300. During the second period, since the first discharge pulse signal DIS_EN1 is activated to the high level, the discharge node N1 is discharged to the voltage level of the discharge voltage terminal VSS (i.e., the level of the ground voltage VSS) by virtue of the first wordline discharge unit 200A.

That is, in the semiconductor memory apparatus having a configuration consistent with the above-described embodiment, the distribution of the threshold voltages of the memory cells connected to the wordlines may be stably maintained because the voltage level of the selected wordline is maintained higher than the voltage levels of the unselected wordlines in a discharge operation mode and all the wordlines are discharged finally to the ground voltage VSS.

As can be readily seen from the above description, a method for discharging a plurality of wordlines of a semiconductor memory apparatus, in which one or more selected wordline is driven by a first wordline control voltage and at least one unselected wordline is driven by a second wordline control voltage with a level lower than the first wordline control voltage, may include forming a discharge current path such that a predetermined voltage difference can be induced between a discharge node of the selected wordline and a common discharge node of the at least one unselected wordline, discharging the common discharge node for a predetermined time, and discharging the discharge node after discharging the common discharge node for the predetermined time.

It should be noted that other embodiments encompassing additional elements that may not be directly associated with the technical features of the present invention may be contemplated in order to describe the present invention in further detail. Moreover, an active high configuration or an active low configuration for indicating the activated states of signals and circuits may vary depending upon a specific embodiment of the present invention.

Furthermore, the configurations of transistors may be varied as the occasion demands in order to realize the same function. For example, the configurations of a PMOS transistor and an NMOS transistor may be replaced with each other, and various types of transistors may be employed to accommodate a specific need and/or configuration.

Since there can be a large number of such variations, and these variations can be easily inferred by those skilled in the art, the enumeration thereof will be omitted herein.

While certain embodiments have been described above, it will be understood to those skilled in the art that the embodiments described are by way of example only. Accordingly, the semiconductor memory apparatus and the method for discharging a wordline thereof described herein should not be limited based on the described embodiments. Rather, the semiconductor memory apparatus and the method for discharging a wordline thereof described herein should only be limited in light of the claims that follow when taken in conjunction with the above description and accompanying drawings.

What is claimed is:

1. A semiconductor apparatus comprising:
   a plurality of lines having a selected line and an unselected line, the selected line being driven by a first control voltage, the unselected line being driven by a second control voltage, the second control voltage being lower than the first control voltage;
   a discharge control unit configured to form a discharge current path between a discharge node of the selected line and a common discharge node of the unselected line and induce a predetermined voltage difference between the discharge node and the common discharge node; and
   a common discharge unit configured to discharge current flowing through the discharge current path.

2. The semiconductor apparatus according to claim 1, wherein the unselected line comprises a plurality of unselected lines, and the number of unselected lines is greater than the number of selected line.

3. The semiconductor apparatus according to claim 2, wherein the selected line comprises a plurality of selected lines.

4. The semiconductor apparatus according to claim 1, wherein the discharge control unit comprises:
   a diode connected between the discharge node and a first node; and
   a connecting part connected between the first node and the common discharge node and controlled by a discharge control pulse signal.

5. The semiconductor apparatus according to claim 1, wherein the common discharge unit comprises a discharge transistor connected between the common discharge node and a discharge voltage terminal and controlled by a common discharge pulse signal.

6. A semiconductor memory apparatus comprising:
   a plurality of wordlines having a selected wordline and an unselected wordline, the selected wordline being driven by a first wordline control voltage, the unselected wordline being driven by a second wordline control voltage, the second wordline control voltage being lower than the first wordline control voltage;
   a discharge control unit configured to form a discharge current path between a discharge node of the selected wordline and a common discharge node of the unselected wordline and induce a predetermined voltage difference between the discharge node and the common discharge node; and
   a common wordline discharge unit configured to discharge current flowing through the discharge current path.

7. The semiconductor memory apparatus according to claim 6, wherein the unselected wordline comprises a plurality of unselected wordlines, and the number of unselected wordlines is greater than the number of selected wordlines.

8. The semiconductor memory apparatus according to claim 7, wherein the selected wordline comprises a plurality of selected wordlines.

9. The semiconductor memory apparatus according to claim 6, wherein the first wordline control voltage comprises a wordline programming voltage, and the second wordline control voltage comprises a wordline pass voltage.

10. The semiconductor memory apparatus according to claim 6, wherein the discharge control unit comprises:
    a diode connected between the discharge node and a first node; and
    a connecting part connected between the first node and the common discharge node and controlled by a discharge control pulse signal.

11. The semiconductor memory apparatus according to claim 6, wherein the common discharge unit comprises:
    a discharge transistor connected between the common discharge node and a discharge voltage terminal and controlled by a common discharge pulse signal.

12. A semiconductor memory apparatus comprising:
    a plurality of wordlines having a selected wordline and an unselected wordline, the selected wordline being driven by a first wordline control voltage, the unselected wordline being driven by a second wordline control voltage, the second wordline control voltage being lower than the first wordline control voltage;
    a discharge control unit configured to form a discharge current path between a discharge node of the selected wordline and a common discharge node of the unselected wordline in response to a discharge control pulse signal, the discharge control unit being further configured to induce a predetermined voltage difference between the discharge node and the common discharge node;
    a first wordline discharge unit configured to discharge the discharge node in response to a first discharge pulse signal;
    a second wordline discharge unit configured to discharge the is common discharge node in response to a second discharge pulse signal; and
    a discharge control signal generation unit configured to generate the discharge control pulse signal, the second discharge pulse signal, and the first discharge pulse signal, wherein the first discharge pulse signal is activated after a predetermined time from an activation timing of the second discharge pulse signal and the discharge control pulse signal.

13. The semiconductor memory apparatus according to claim 12, wherein the unselected wordline comprises a plurality of unselected wordlines, and the number of unselected wordlines is greater than the number of selected wordlines.

14. The semiconductor memory apparatus according to claim 13, wherein the selected wordline comprises a plurality of selected wordlines.

15. The semiconductor memory apparatus according to claim 12, wherein the discharge control pulse signal is deactivated before an activation timing of the first discharge pulse signal.

16. The semiconductor memory apparatus according to claim 12, wherein the first wordline control voltage comprises a wordline programming voltage, and the second wordline control voltage comprises a wordline pass voltage.

17. The semiconductor memory apparatus according to claim 12, wherein the discharge control unit comprises:
   a diode connected between the discharge node and a first node; and
   a connecting part connected between the first node and the common discharge node and controlled by the discharge control pulse signal.

18. The semiconductor memory apparatus according to claim 12, wherein the first wordline discharge unit comprises:
   a transistor connected between the discharge node and a discharge voltage terminal and controlled by the first discharge pulse is signal.

19. The semiconductor memory apparatus according to claim 12, wherein the second wordline discharge unit comprises:
   a transistor connected between the common discharge node and the discharge voltage terminal and controlled by the second discharge pulse signal.

\* \* \* \* \*